(12) United States Patent
Chen et al.

(10) Patent No.: US 10,646,040 B2
(45) Date of Patent: May 12, 2020

(54) SUPPORTING ASSEMBLY FOR RACK SYSTEM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 3 days.

(21) Appl. No.: 15/956,085

(22) Filed: Apr. 18, 2018

(65) Prior Publication Data
US 2019/0183247 A1 Jun. 20, 2019

(30) Foreign Application Priority Data
Dec. 18, 2017 (TW) .............................. 106144677 A

(51) Int. Cl.
| A47B 96/14 | (2006.01) |
| A47B 47/00 | (2006.01) |
| A47B 47/02 | (2006.01) |
| H05K 7/14  | (2006.01) |

(52) U.S. Cl.
CPC ...... *A47B 96/1441* (2013.01); *A47B 47/0058* (2013.01); *A47B 47/024* (2013.01); *H05K 7/1489* (2013.01)

(58) Field of Classification Search
CPC ............ A47B 96/1441; A47B 47/0058; A47B 47/024; H05K 7/1489
See application file for complete search history.

(56) References Cited

U.S. PATENT DOCUMENTS

| 6,398,041 B1 | 6/2002 | Abbott |
| 6,609,619 B2 | 8/2003 | Abbott |
| 6,948,691 B2 * | 9/2005 | Brock ...................... H02B 1/34 211/175 |
| 6,999,309 B2 * | 2/2006 | Hsu ........................ G06F 1/184 312/223.1 |
| 7,134,802 B2 * | 11/2006 | Doerr ...................... E05C 19/06 403/322.1 |
| 7,364,244 B2 * | 4/2008 | Sandoval ............. H05K 7/1411 312/333 |
| 7,810,653 B2 | 10/2010 | Schmidtke et al. |

(Continued)

*Primary Examiner* — Patrick D Hawn
(74) *Attorney, Agent, or Firm* — Rosenberg, Klein & Lee

(57) ABSTRACT

A rack system includes a rack, a supporting assembly, an object to be carried, and a blocking kit. The rack includes a front post and a rear post. The supporting assembly is mounted on the front post and the rear post. The object is carried by the supporting assembly. The blocking kit includes a connecting base and a blocking member. The connecting base is mounted on the front post, and the blocking member is arranged at the connecting base. When the object reaches a second position after displacement from a first position, the blocking member is at a locked position to block the object and thereby prevent the object from displacement from the second position in a certain direction.

14 Claims, 16 Drawing Sheets

(56) References Cited

U.S. PATENT DOCUMENTS

| | | | | |
|---|---|---|---|---|
| 8,496,493 B2* | 7/2013 | Lin | ............... | G06F 1/187 |
| | | | | 439/345 |
| 9,861,196 B2* | 1/2018 | Chen | ............... | E05B 65/463 |
| 10,028,406 B2* | 7/2018 | Chen | ............... | A47B 88/467 |
| 10,123,452 B2* | 11/2018 | Chen | ............... | A47B 88/43 |
| 10,136,548 B2* | 11/2018 | Chen | ............... | F16C 29/004 |
| 10,292,493 B2* | 5/2019 | Chen | ............... | A47B 88/43 |
| 10,292,496 B2* | 5/2019 | Chen | ............... | A47B 57/34 |
| 10,321,599 B2* | 6/2019 | Chen | ............... | A47B 96/066 |
| 10,334,950 B2* | 7/2019 | Chen | ............... | A47B 88/423 |
| 10,376,055 B2* | 8/2019 | Chen | ............... | A47B 88/53 |
| 2001/0040203 A1* | 11/2001 | Brock | ............... | H02B 1/34 |
| | | | | 248/222.11 |
| 2002/0108914 A1* | 8/2002 | Abbott | ............... | H02B 1/36 |
| | | | | 211/26 |
| 2005/0088069 A1* | 4/2005 | Greenwald | ............... | A47B 88/49 |
| | | | | 312/333 |
| 2011/0180316 A1* | 7/2011 | Nakayama | ............... | H05K 7/1421 |
| | | | | 174/520 |
| 2016/0296016 A1* | 10/2016 | Chen | ............... | H05K 7/1489 |
| 2017/0079428 A1* | 3/2017 | Chen | ............... | E05B 65/463 |
| 2017/0099743 A1* | 4/2017 | Spencer | ............... | G06F 1/183 |
| 2018/0014644 A1* | 1/2018 | Chen | ............... | A47B 88/423 |
| 2018/0027690 A1* | 1/2018 | Chen | ............... | F16C 29/004 |
| | | | | 384/41 |
| 2018/0098626 A1* | 4/2018 | Chen | ............... | A47B 88/43 |
| 2018/0125234 A1* | 5/2018 | Chen | ............... | H05K 7/1489 |
| 2019/0183247 A1* | 6/2019 | Chen | ............... | A47B 47/024 |

* cited by examiner

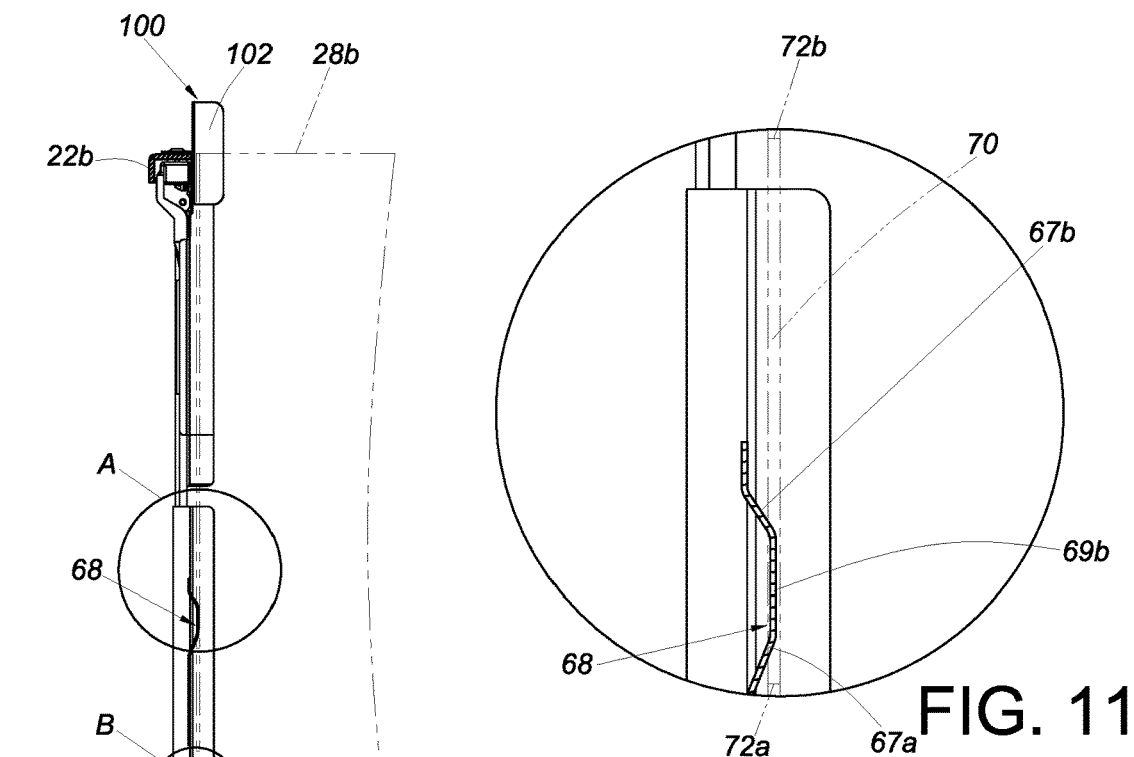
FIG. 11
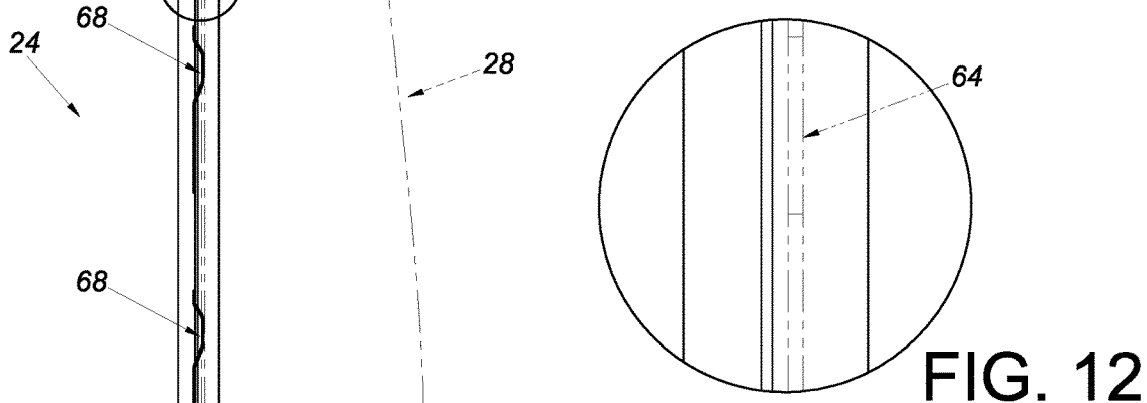
FIG. 12
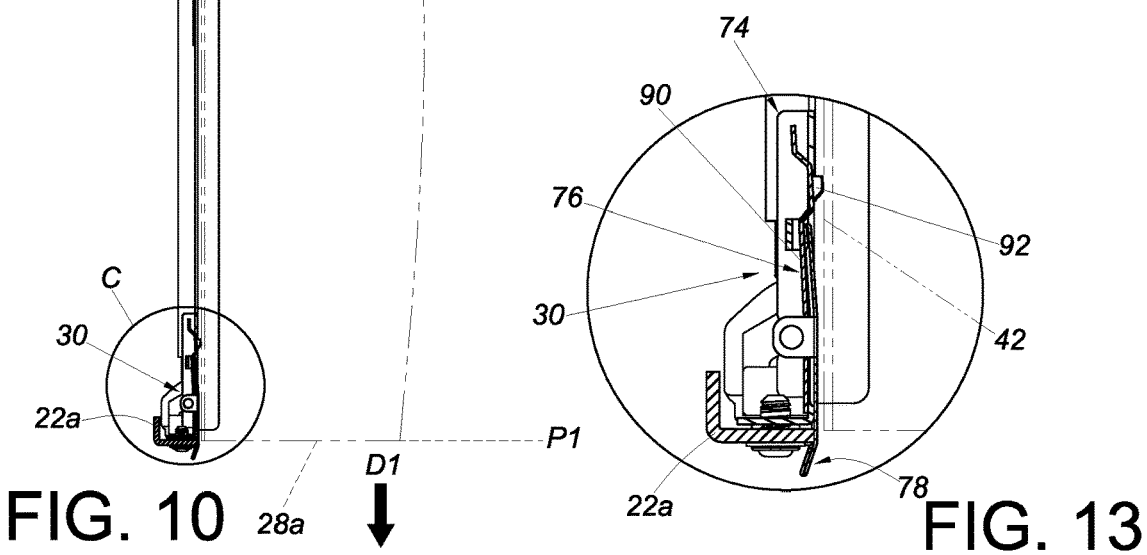
FIG. 10
FIG. 13

SUPPORTING ASSEMBLY FOR RACK SYSTEM

BACKGROUND OF THE INVENTION

1. Technical Field

The present invention relates to a rack system and more particularly to a supporting assembly for a rack system.

2. Description of Related Art

Generally, a rack system includes slide rails for mounting a piece of electronic equipment or its chassis to the posts of a rack. U.S. Pat. No. 6,398,041 B1, for example, discloses a snap system for latching a chassis (11) such that, while the chassis (11) is in a rack, the latches (30L, 30R) at the left and right front ends of the chassis (11) can engage with the left and right front columns (13L, 13R) of the rack respectively.

When operating such a rack system, however, it is sometimes required to pull the electronic equipment or chassis in the rack outward to a predetermined position, and it is important that the electronic equipment or chassis be kept from leaving the predetermined position inadvertently.

BRIEF SUMMARY OF THE INVENTION

One objective of the present invention is to provide a supporting assembly configured for a rack system and having a blocking mechanism for preventing the object carried by the supporting assembly from moving away from a predetermined position in a certain direction.

Another objective of the present invention is to provide a supporting assembly configured for a rack system and, thanks to cooperation between a first feature and a second feature, capable of preventing a rear portion of the object carried by the supporting assembly from tilting up with respect to a front portion of the object while the object is being displaced from a first position toward a second position.

According to one aspect of the present invention, a rack system includes a rack, a first supporting assembly, a second supporting assembly, an object to be carried, and a blocking kit. The rack includes a plurality of posts. The first supporting assembly is mounted on a first side of the rack while the second supporting assembly is mounted on a second side of the rack. The object is supported between the first supporting assembly and the second supporting assembly. The blocking kit is coupled to the rack and includes a connecting base and a blocking member. The connecting base is detachably mounted on one of the posts, and the blocking member can be moved to either one of a locked position and an unlocked position with respect to the connecting base. When the object reaches a second position from a first position after displacement in a first direction, the blocking member is at the locked position to block the object and thereby prevent the object from displacement from the second position in the first direction. When the blocking member is at the unlocked position, the object is no longer blocked by the blocking member and can therefore leave the second position.

Preferably, the blocking member is arranged at the connecting base and can be operated in order to be moved.

Preferably, the connecting base includes a mounting portion and a side portion substantially perpendicularly connected to the mounting portion. The mounting portion is detachably connected to the aforesaid one of the posts, and the blocking member is located at the side portion.

Preferably, the object includes a first sidewall and a second sidewall. The first sidewall and the second sidewall correspond in position to the first supporting assembly and the second supporting assembly respectively. At least one of the two sidewalls has a front end portion and a rear end portion, and there is a structural feature between the front end portion and the rear end portion of said at least one of the two sidewalls. When the object is at the second position and the blocking member is at the locked position, the blocking member blocks the object through the structural feature.

Preferably, the rack system further includes a first feature and a second feature. The first feature is provided at one of the first supporting assembly and the object and at least is an elastic member. The second feature is provided at the other of the first supporting assembly and the object and is a longitudinal space with a border. The first feature and the second feature are configured to work with each other to prevent a rear portion of the object from tilting up with respect to a front portion of the object while the object is being displaced from the first position toward the second position.

Preferably, the first feature is provided at the first supporting assembly, and the second feature is provided at the first sidewall as the longitudinal space with the border.

Preferably, the longitudinal space with the border has a first end and a second end opposite the first end.

Preferably, one of the first supporting assembly and the second supporting assembly includes a first supporting frame and a second supporting frame. The first supporting frame and the second supporting frame are connected in such a way that they can extend and retract with respect to each other. A front mounting member is arranged at the first supporting frame while a rear mounting member is arranged at the second supporting frame. The front mounting member and the rear mounting member are mounted on a front post and a rear post of the rack respectively. The connecting base of the blocking kit is detachably mounted on the front post.

Preferably, the first supporting frame includes a vertical portion and a horizontal portion, wherein the horizontal portion is substantially perpendicularly connected to the vertical portion and is configured to support a bottom portion of the object.

Preferably, an auxiliary frame is arranged at the second supporting frame. The auxiliary frame can be displaced, and thus adjusted, along the length direction of the second supporting frame and includes a vertical portion and a horizontal portion. The horizontal portion of the auxiliary frame is substantially perpendicularly connected to the vertical portion of the auxiliary frame and is configured for supporting the bottom portion of the object.

Preferably, the rack system further includes a retaining member detachably mounted on the rear post. When the object is at the first position, a retaining portion of the retaining member corresponds in position to a top portion of the object.

According to another aspect of the present invention, a rack system includes a rack, a supporting assembly, an object to be carried, and a blocking kit. The rack includes a front post and a rear post. The supporting assembly is mounted on the front post and the rear post via a front mounting member and a rear mounting member respectively. The object is carried by the supporting assembly. The blocking kit is coupled to the rack and includes a connecting base and a blocking member. The connecting base is mounted on the front post, and the blocking member is arranged at the connecting base. When the object reaches a second position from a first position after displacement in a first direction, the blocking member is at a locked position to block the object and thereby prevent the object from displacement from the second position in the first direction. The object can leave the second position when the blocking member is at an unlocked position.

According to still another aspect of the present invention, a supporting assembly for a rack system includes a first supporting frame, a second supporting frame, and a first feature. The first supporting frame includes a vertical portion and a horizontal portion substantially perpendicularly connected to the vertical portion. The second supporting frame is connected to the first supporting frame in such a way that they can extend and retract with respect to each other. The first feature is provided at the first supporting frame, at least is an elastic member, and is arranged along the length direction of the first supporting frame.

Preferably, the supporting assembly further includes an auxiliary frame that can be displaced, and thus adjusted, in the length direction of the second supporting frame to either one of a first adjusted position and a second adjusted position. The auxiliary frame includes a vertical portion and a horizontal portion substantially perpendicularly connected together.

Preferably, the supporting assembly further includes a blocking kit. The blocking kit includes a connecting base and a blocking member. The blocking member is arranged at the connecting base and can be moved to either one of a locked position and an unlocked position.

Preferably, the first supporting frame is mounted on a front post via a front mounting member, the second supporting frame is mounted on a rear post via a rear mounting member, and the blocking kit is coupled to the front post. When the blocking member is at the locked position, the object supported by the supporting assembly is blocked from displacement in a predetermined direction.

BRIEF DESCRIPTION OF THE SEVERAL VIEWS OF THE DRAWINGS

FIG. 10 is a partial top view of the rack system in an embodiment of the present invention, with the object at a first position with respect to the supporting assembly and displaceable in a first direction;

FIG. 11 is an enlarged view of the circled area A in FIG. 10;

FIG. 12 is an enlarged view of the circled area B in FIG. 10;

FIG. 13 is an enlarged view of the circled area C in FIG. 10;

DETAILED DESCRIPTION OF THE INVENTION

Figure 1:
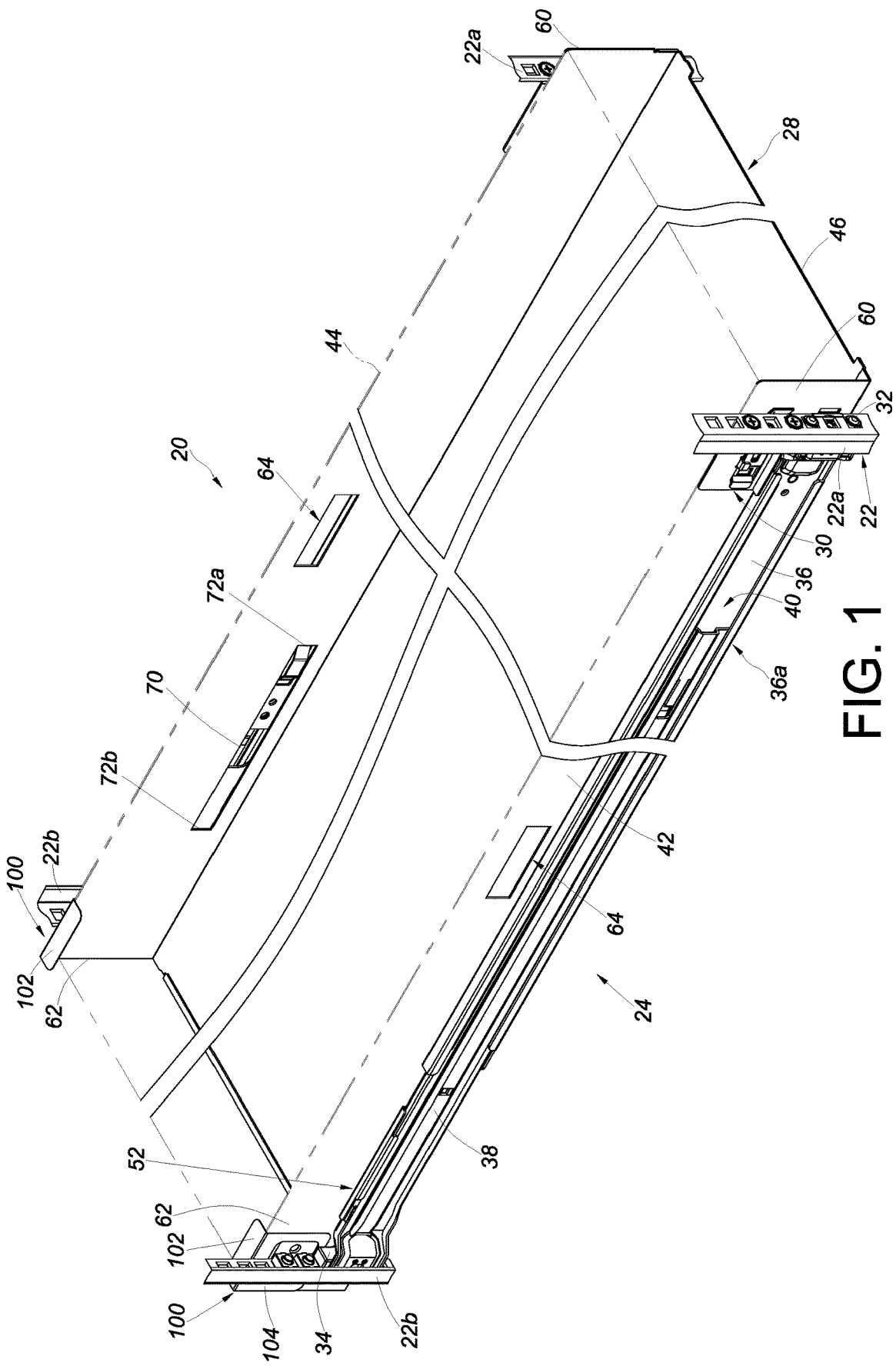
FIG. 1 is a perspective view of the rack system in an embodiment of the present invention.
Figure 2:
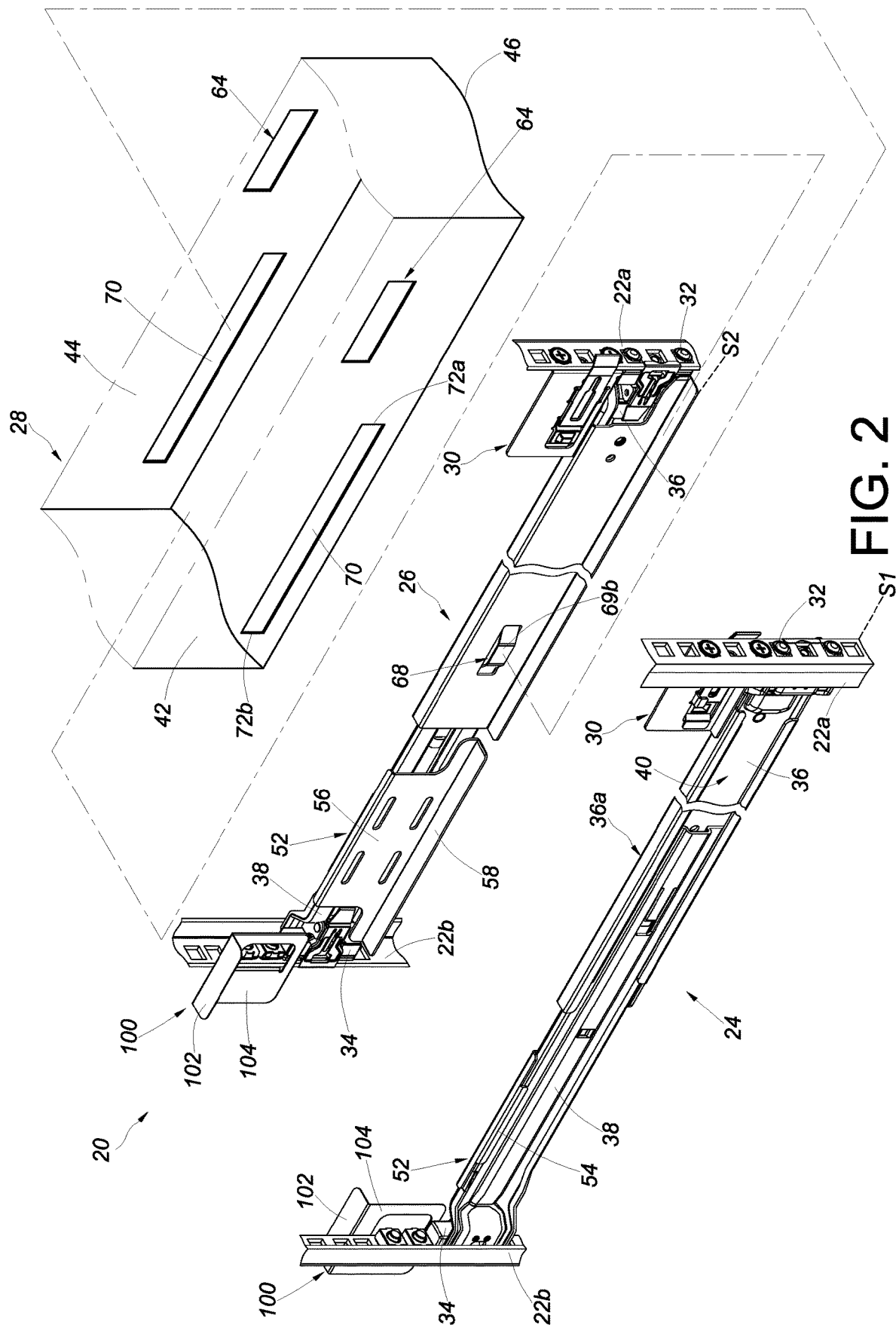
FIG. 2 is an exploded perspective view of the rack system in an embodiment of the present invention, showing in particular the pair of supporting assembles mounted on the rack and the object to be carried by the supporting assemblies.

Referring to FIG. 1 and FIG. 2, a rack system 20 includes a rack 22, a first supporting assembly 24, a second supporting assembly 26, an object 28, and a blocking kit 30.

The rack 22 includes a plurality of posts. Here, the rack 22 includes a pair of front posts 22a and a pair of rear posts 22b by way of example.

The first supporting assembly 24 (also referred to herein as the supporting assembly) is mounted on a first side S1 of the rack 22. The first supporting assembly 24 is mounted on the corresponding front post 22a of the rack 22 via at least one front mounting member 32 and is mounted on the corresponding rear post 22b of the rack 22 via at least one rear mounting member 34.

The second supporting assembly 26 is mounted on a second side S2 of the rack 22. The second supporting assembly 26 has substantially the same structural configuration as the first supporting assembly 24 and, for the sake of brevity, will not be described in more detail. Preferably, the first supporting assembly 24 (or the second supporting assembly 26) includes a first supporting frame 36 and a second supporting frame 38. The first supporting frame 36 and the second supporting frame 38 are connected in such a way that they can extend and retract with respect to each other. For example, one of the first supporting frame 36 and the second supporting frame 38 defines a longitudinal channel 40 in which the other of the first supporting frame 36 and the second supporting frame 38 can be movably mounted. The front mounting member 32 is arranged at the first supporting frame 36, and the rear mounting member 34 is arranged at the second supporting frame 38.

The object 28 is, for example, the chassis of a piece of electronic equipment but is not necessarily so in practice. The object 28 is supported between the first supporting assembly 24 and the second supporting assembly 26.

Preferably, the object 28 includes a first sidewall 42, a second sidewall 44, and a bottom portion 46 connected between the first sidewall 42 and the second sidewall 44. The first sidewall 42 and the second sidewall 44 correspond in position to the first supporting assembly 24 and the second supporting assembly 26 respectively. In this embodiment, the first sidewall 42 and the second sidewall 44 have substantially the same structural configuration, but the two sidewalls do not necessarily do so in practice.

Figure 3:
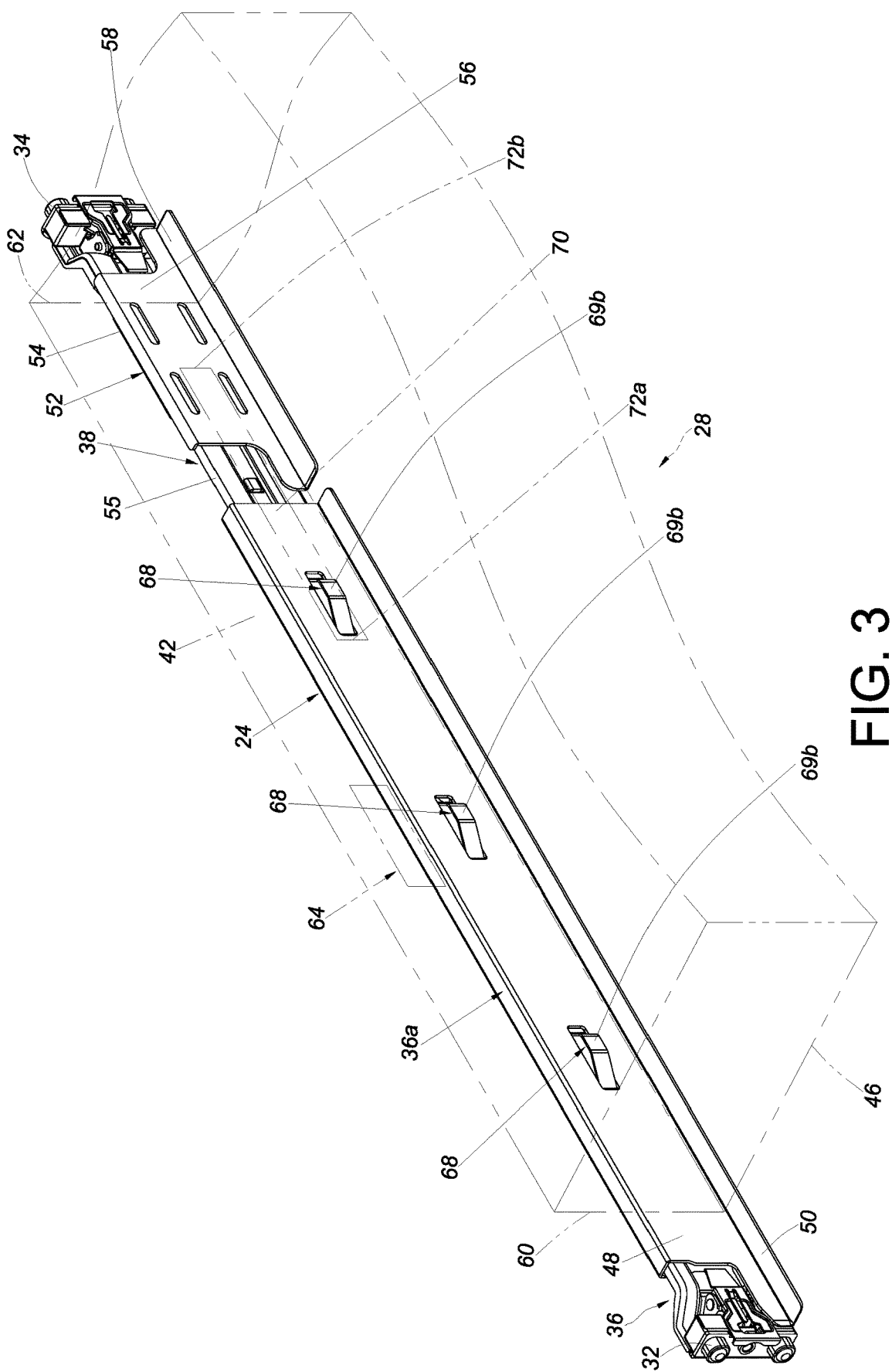
FIG. 3 is a perspective view showing the supporting assembly carrying the object in an embodiment of the present invention.
Figure 4:
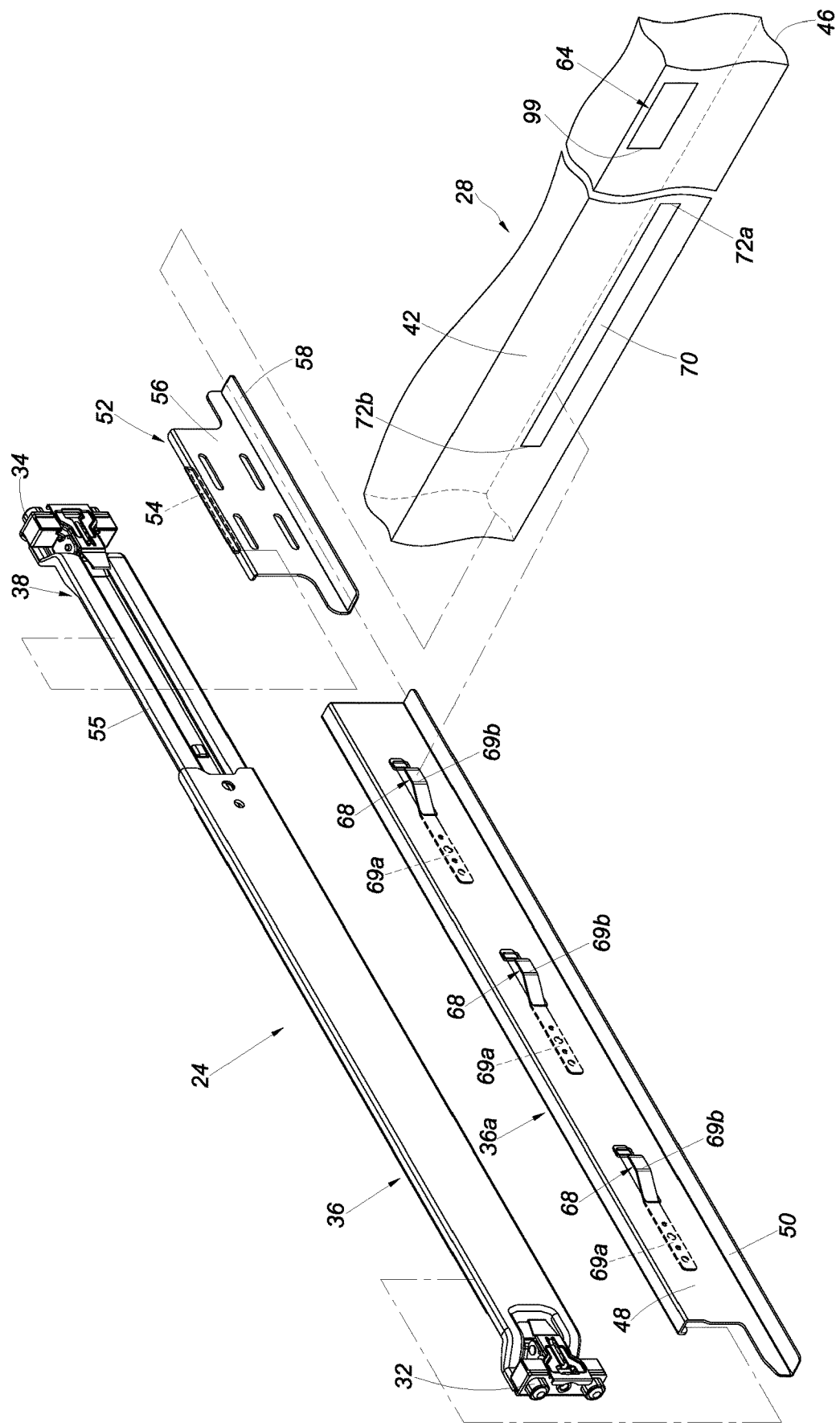
FIG. 4 is an exploded perspective view of the supporting assembly and the object in an embodiment of the present invention.

As shown in FIG. 3 and FIG. 4, the first supporting frame 36 includes a vertical portion 48 and a horizontal portion 50 substantially perpendicularly connected to the vertical portion 48. The horizontal portion 50 is configured to support a front part of the bottom portion 46 of the object 28; in other words, the object 28 can be carried by the first supporting assembly 24 and the second supporting assembly 26. In this embodiment, a fitting 36a is attached to the first supporting frame 36 and can be viewed as a portion of the first supporting frame 36, and the fitting 36a has the vertical portion 48 and the horizontal portion 50 by way of example. It is worth mentioning that the first supporting frame 36 may directly incorporate the vertical portion 48 and the horizontal portion 50 just as well; the present invention has no limitation in this regard.

Preferably, an auxiliary frame 52 is arranged at the second supporting frame 38 and can be adjusted, or displaced, along the length direction of the second supporting frame 38. For example, the auxiliary frame 52 includes a bent portion 54 movably pressed against an upper wall 55 of the second supporting frame 38. The auxiliary frame 52 includes a vertical portion 56 and a horizontal portion 58 substantially perpendicularly connected to the vertical portion 56. The horizontal portion 58 is configured to support a rear part of the bottom portion 46 of the object 28.

Preferably, one of the first sidewall 42 and the second sidewall 44 of the object 28 (e.g., the first sidewall 42) has a front end portion 60 and a rear end portion 62, and a structural feature 64 is located between the front end portion 60 and the rear end portion 62. When viewed from the outside, the structural feature 64 may be a hole, a groove, or the wall of a recess for example; the present invention has no limitation in this regard.

Preferably, the rack system 20 further includes at least one first feature 68 provided at one of the first supporting assembly 24 and the object 28. In this embodiment, the first feature 68 is provided at the first supporting assembly 24 and at least is an elastic member for example. Preferably, a plurality of elastic members are provided as the at least one first feature 68. The rack system 20 preferably further includes a second feature 70 provided at the other of the first supporting assembly 24 and the object 28. In this embodiment, the second feature 70 is provided at the first sidewall 42 of the object 28 and is, for example, a longitudinal space with a border. Here, by way of example, three first features 68 are arranged along the length direction of the first supporting frame 36, and each first feature 68 is an elastic member that includes a fixed portion 69a and an elastic portion 69b connected to the fixed portion 69a. Preferably, the second feature 70 has a first end 72a and a second end 72b respectively adjacent to the two end portions (e.g., a front end portion and a rear end portion) of the second feature 70.

Figure 5:
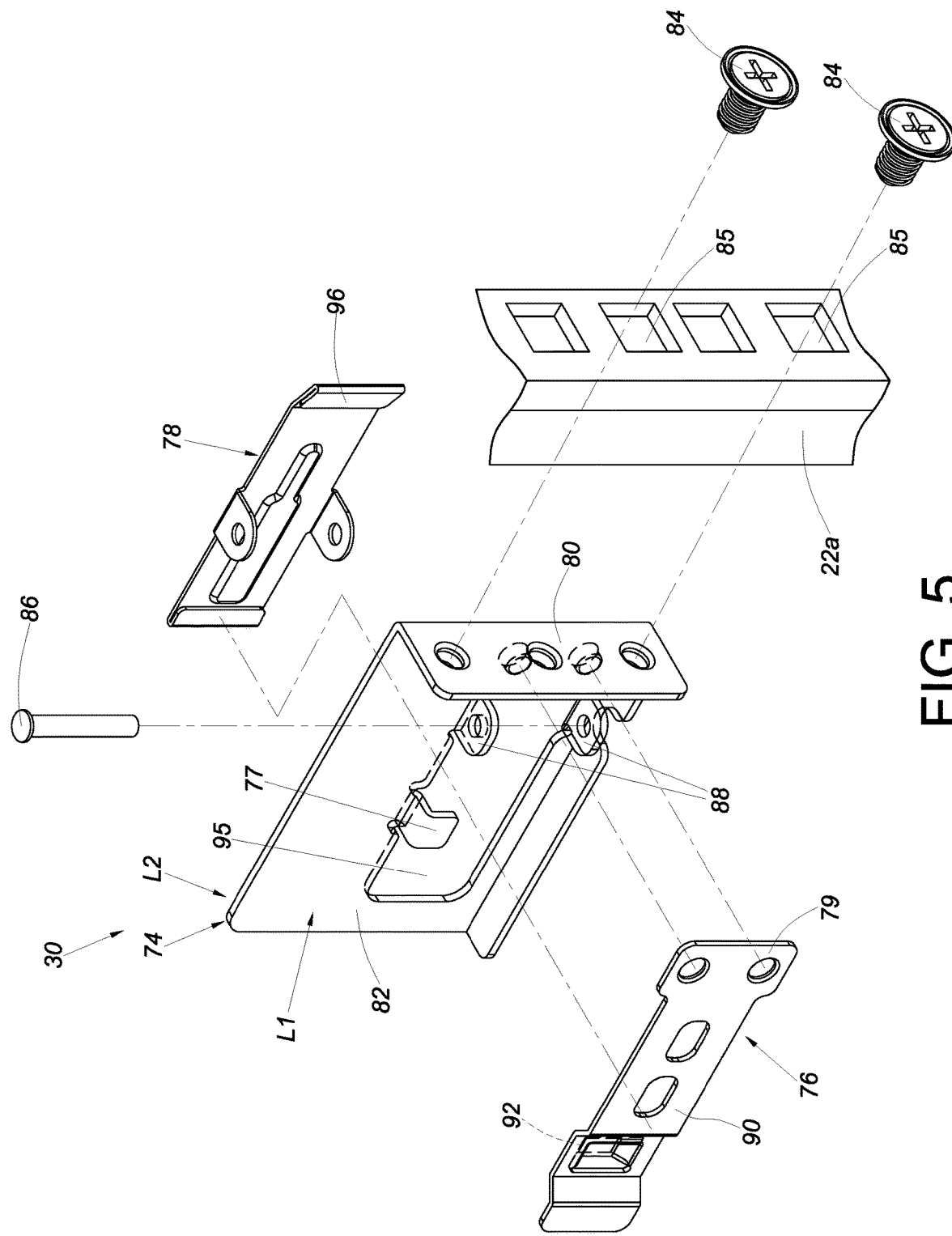
FIG. 5 is an exploded perspective view of the rack and the blocking kit in an embodiment of the present invention.
Figure 6:
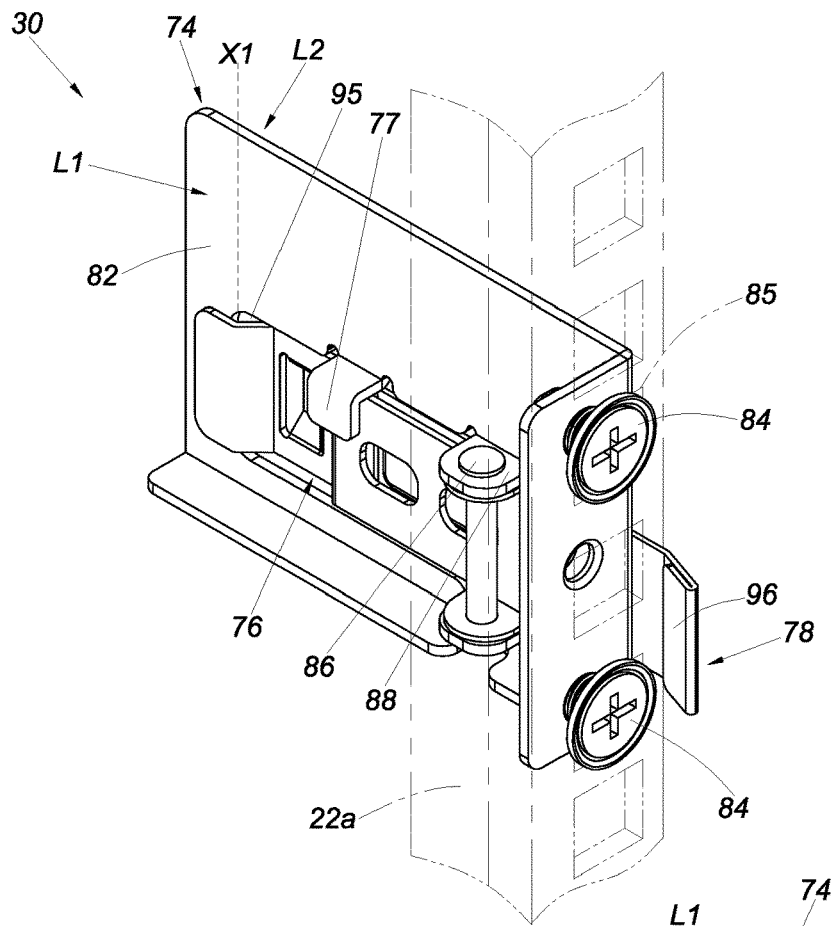
FIG. 6 is an assembled perspective view of the rack and the blocking kit in an embodiment of the present invention.
Figure 7:
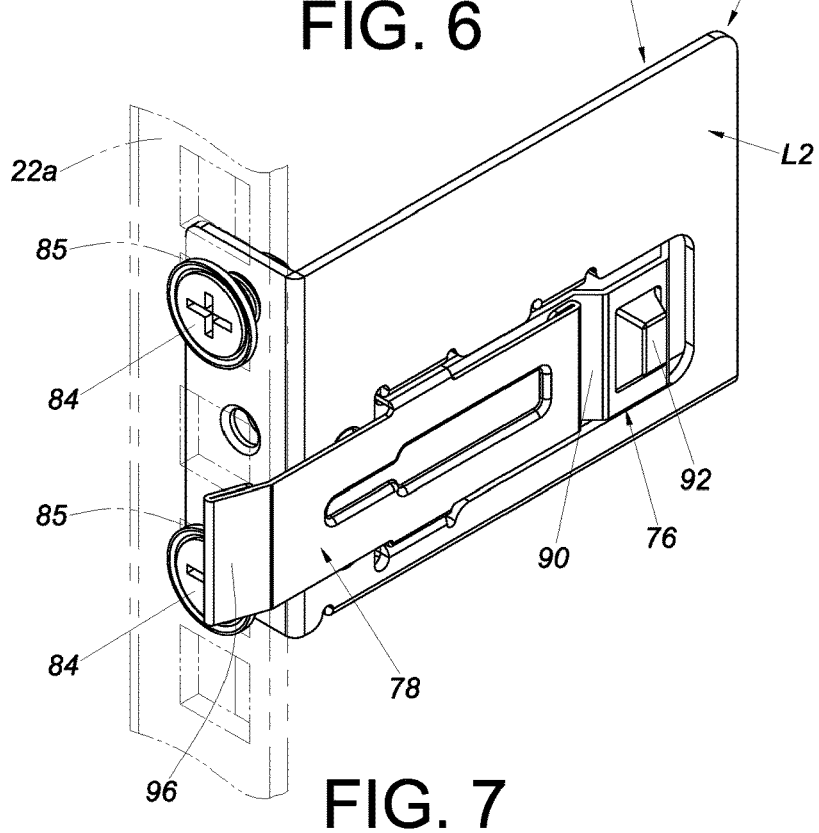
FIG. 7 is an assembled perspective view from a different angle showing the rack and the blocking kit in an embodiment of the present invention.

Referring to FIG. 5, FIG. 6, and FIG. 7, the blocking kit 30 is coupled to one of the posts of the rack 22. Here, the blocking kit 30 is coupled to one of the front posts 22a of the rack 22 by way of example.

More specifically, the blocking kit 30 includes a connecting base 74 and a blocking member 76. The connecting base 74 is detachably mounted on the front post 22a. The blocking member 76 is arranged at the connecting base 74, and an operating member 78 is provided to operate the blocking member 76. Preferably, the operating member 78 includes an operating portion 96 configured to be operated, or more particularly to be pressed, by a user.

The connecting base 74 includes a mounting portion 80 and a side portion 82, wherein the side portion 82 is bent with respect to the mounting portion 80. Here, the side portion 82 is substantially perpendicularly connected to the mounting portion 80, and the mounting portion 80 is detachably connected to the front post 22a. For example, the mounting portion 80 is locked to the front post 22a by a locking member 84 passing through a mounting hole 85 of the front post 22a. The side portion 82, on the other hand, includes an opening 95 in communication with a first side L1 and a second side L2 of the side portion 82. A position-limiting portion 77 and a lug 88 are adjacent to the opening 95. The position-limiting portion 77 is bent with respect to the side portion 82 while the lug 88 protrudes from the side portion 82.

The blocking member 76 includes a connecting portion 79, an elastic arm 90, and a blocking portion 92. The connecting portion 79 is connected to the connecting base 74 (e.g., to the side portion 82). The elastic arm 90 extends from the connecting portion 79 and corresponds in position to the opening 95. The blocking portion 92 is connected to the elastic arm 90 and can pass from the first side L1 to the second side L2 of the side portion 82. The first side L1 and the second side L2 are opposite sides of the side portion 82.

The operating member 78 is pivotally connected to the lug 88 of the connecting base 74 by a shaft member 86. In addition, the operating member 78 is connected to or abutted against the elastic arm 90 of the blocking member 76.

Figure 8:
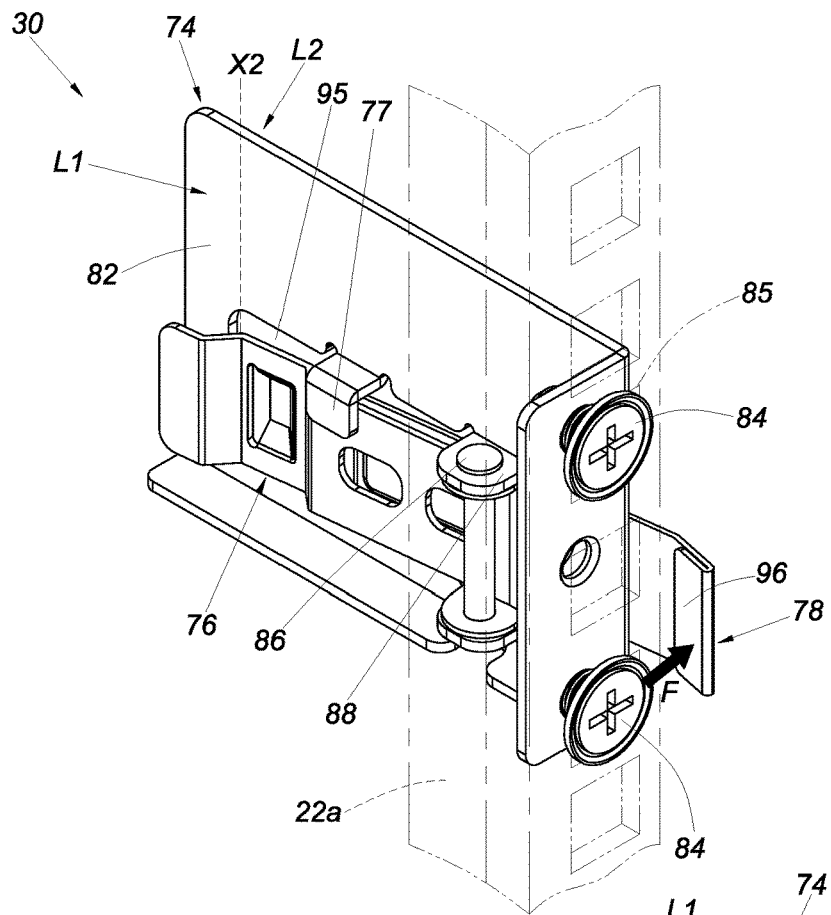
FIG. 8 is a perspective view showing the blocking member of the blocking kit being operated in an embodiment of the present invention.
Figure 9:
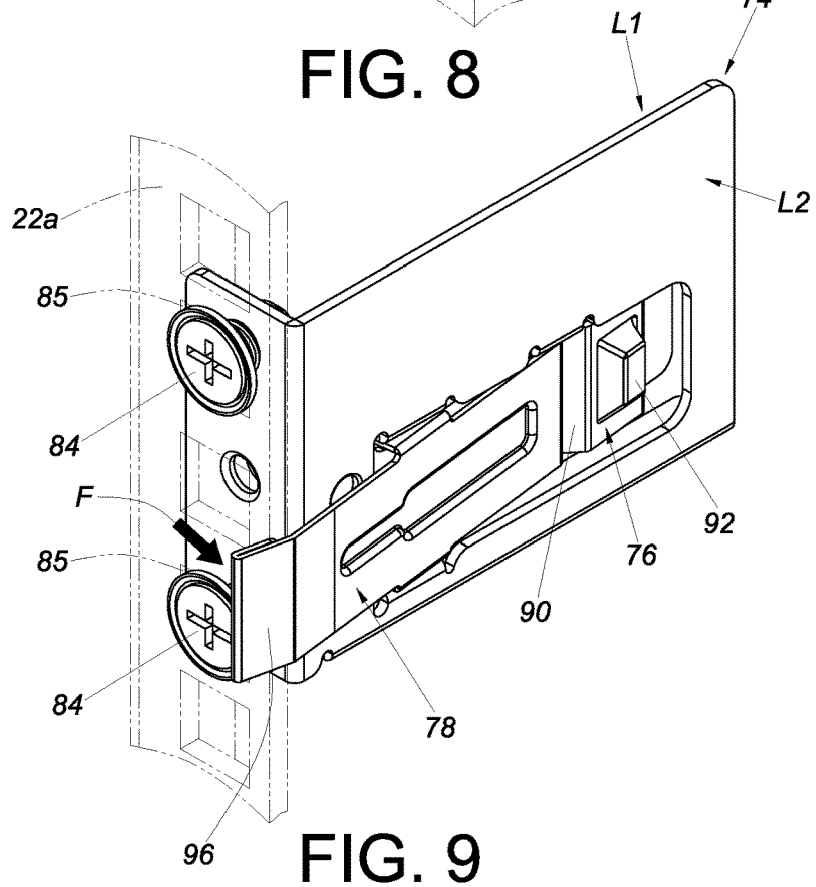
FIG. 9 is a perspective view from a different angle showing the blocking member of the blocking kit being operated in an embodiment of the present invention.

As shown in FIG. 6 to FIG. 9, the blocking member 76 can be operated and thus moved with respect to the connecting base 74 from a locked position X1 (see FIG. 6 and FIG. 7) to an unlocked position X2 (see FIG. 8 and FIG. 9).

More specifically, a user may operate the blocking member 76 either directly or by applying a force F to the blocking member 76 through the operating member 78 (or the operating portion 96 to be exact) (see FIG. 8 and FIG. 9) in order to move the blocking member 76 from the locked position X1 to the unlocked position X2.

In FIG. 10 and FIG. 11, the object 28 is shown as located at a first position P1 with respect to the first supporting assembly 24. A portion (e.g., the elastic portion 69b) of one of the three first features 68 (e.g., the first feature 68 closest to the rear post 22b) can work with the second feature 70 (as can be seen more clearly in FIG. 3) so that, while the object 28 is being displaced from the first position P1 in a first direction D1, a portion (e.g., a rear portion 28b) of the object 28 is kept from tilting up with respect to another portion (e.g., a front portion 28a) of the object 28. Preferably, the elastic portion 69b of each first feature 68 has a first section 67a and a second section 67b, wherein the first section 67a and the second section 67b include one of an inclined surface and a curved surface to help the second feature 70 move smoothly past each first feature 68 while the object 28 is displaced in the first direction D1 (or in a second direction, which is the opposite direction of the first direction D1).

While the object 28 is at the first position P1, the structural feature 64 is quite a distance away from the blocking kit 30, as shown in FIG. 12, and the elastic arm 90 of the blocking member 76 of the blocking kit 30 is pushed by the object 28 (e.g., by the first sidewall 42 of the object 28) such that the blocking portion 92 is a small distance away from the locked position X1.

Figure 14:
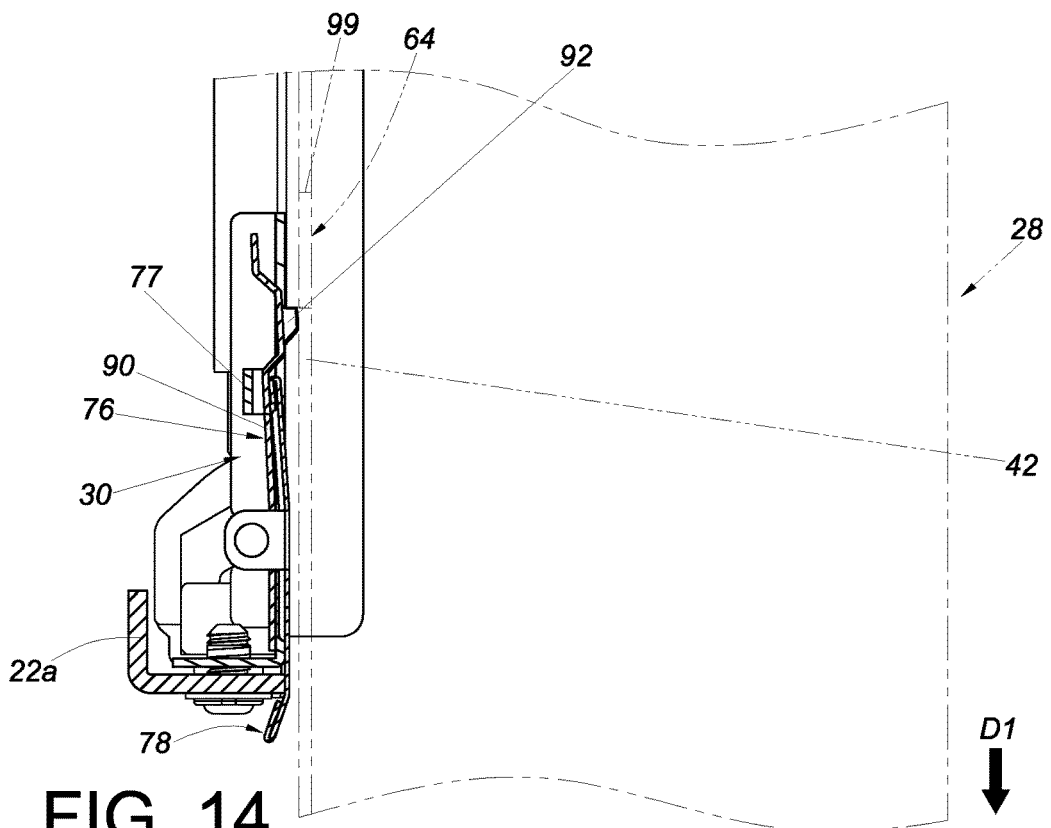
FIG. 14 shows the object being displaced in the first direction in accordance with an embodiment of the present invention.

When the object 28 is pulled out in the first direction D1 and reaches a predetermined position, referring to FIG. 14, the blocking member 76 remains pushed by the object 28, and the elastic arm 90 of the blocking member 76 stores a certain amount of elastic energy as a result.

Figure 15:
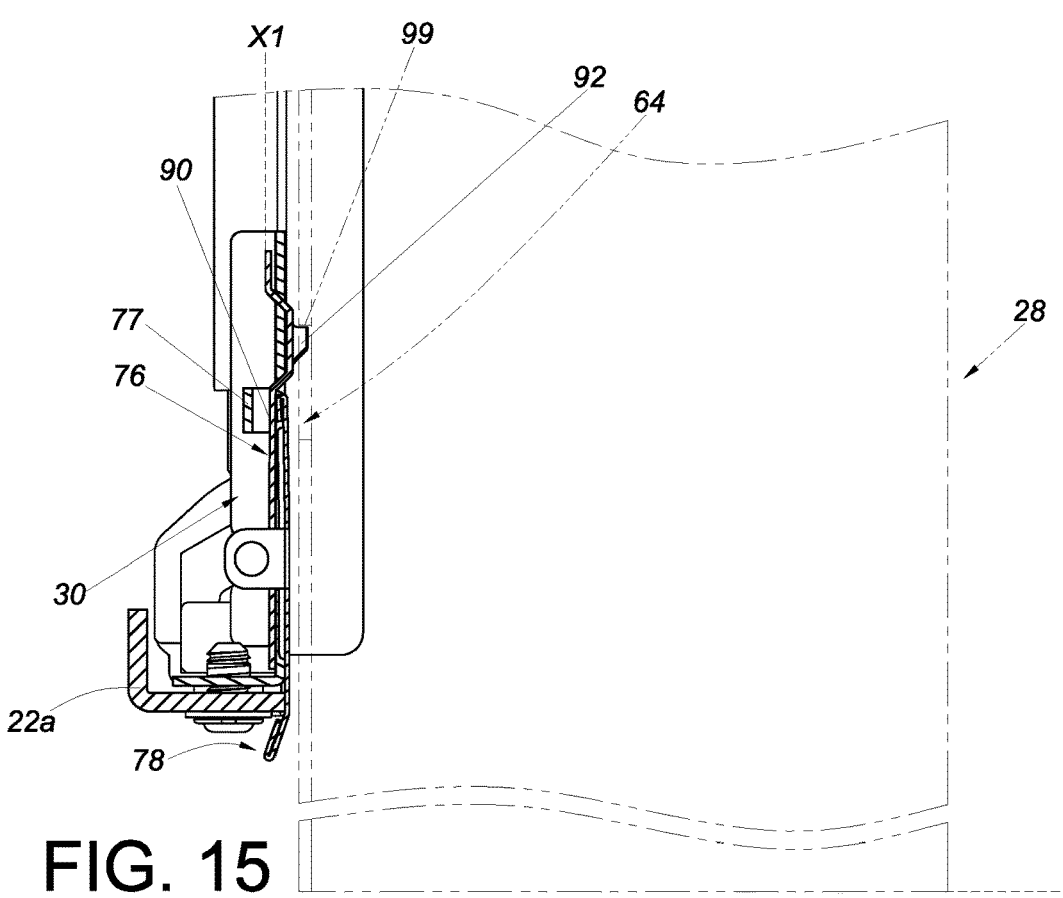
FIG. 15 shows that the object is further displaced in the first direction and reaches a second position such that the blocking member of the blocking kit is at a locked position, in accordance with an embodiment of the present invention.

Once the object 28 is further displaced in the first direction D1 and reaches a second position P2, referring to FIG. 15, the blocking member 76 is at the locked position X1 to block the object 28 and thereby prevent the object 28 from displacement from the second position P2 in the first direction D1. More specifically, when the object 28 is at the second position P2, the elastic arm 90 of the blocking member 76 releases the stored elastic energy and ends up at the locked position X1, with the blocking portion 92 of the blocking member 76 engaged with or locked to the structural feature 64. Furthermore, a portion of the object 28 (e.g., a wall 99 of the structural feature 64) is blocked by the blocking portion 92 of the blocking member 76. In other words, when the object 28 is at the second position P2 and the blocking member 76 is at the locked position X1, the object 28 is blocked by the blocking member 76 through the wall 99 of the structural feature 64 and is thereby kept from further displacement from the second position P2 in the first direction D1.

Figure 16:
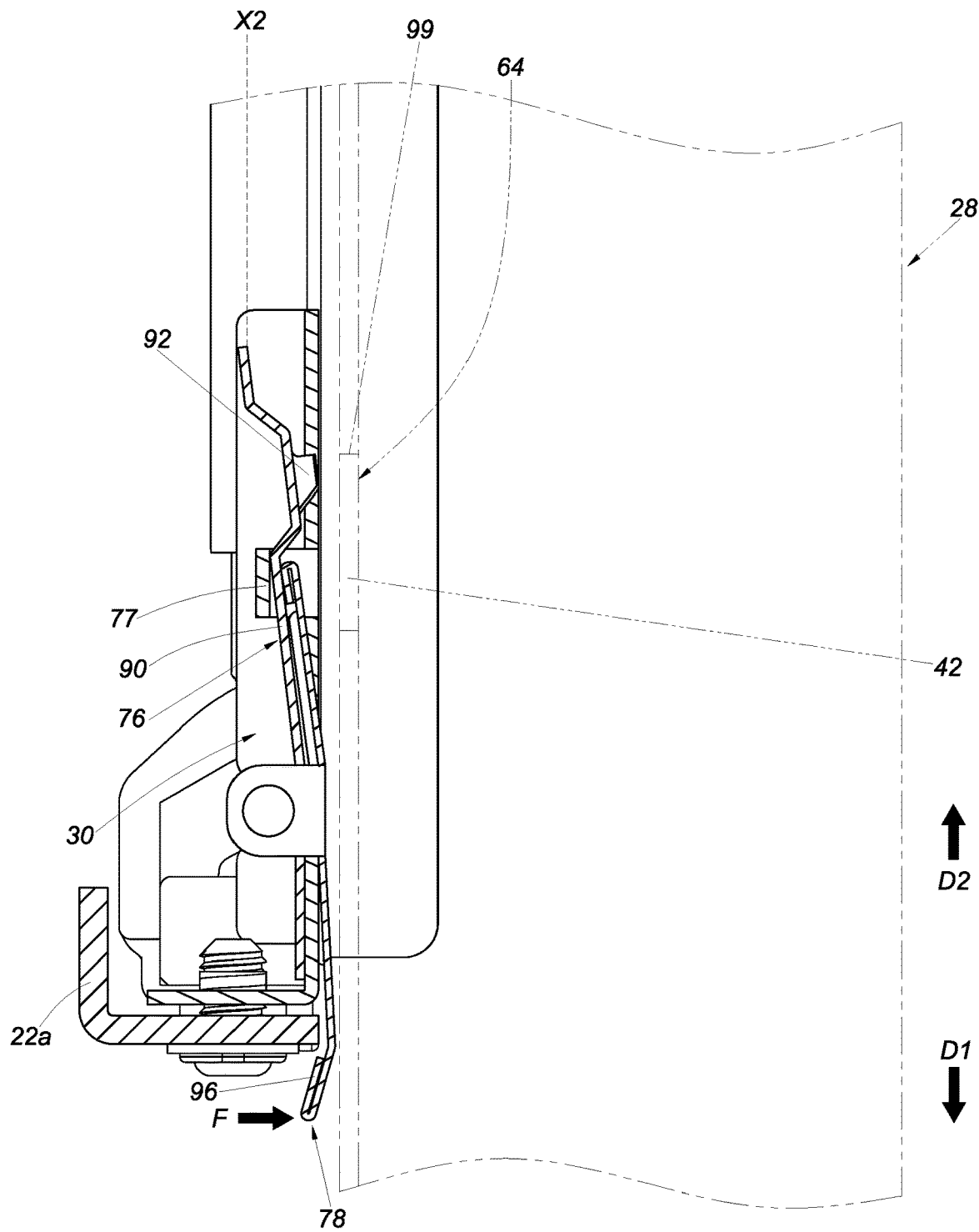
FIG. 16 shows that the object is at the second position and the blocking member of the blocking kit is at an unlocked position, in accordance with an embodiment of the present invention.

Referring to FIG. 16, when it is desired to disengage or unlock the blocking portion 92 of the blocking member 76 from the structural feature 64, a user may operate the blocking member 76 either directly or by applying a force F to the blocking member 76 through the operating member 78 (or more particularly the operating portion 96) in order to move the blocking member 76 from the locked position X1 to the unlocked position X2. While the blocking member 76 is at the unlocked position X2, the blocking portion 92 of the blocking member 76 blocks the object 28 no more so that the object 28 can be further displaced from the second position P2 in the first direction D1 or be displaced from the second position P2 toward the first position P1 in the second direction D2. It is worth mentioning that the elastic arm 90 of the blocking member 76 is blocked by the position-limiting portion 77 while at the unlocked position X2.

Figure 17:
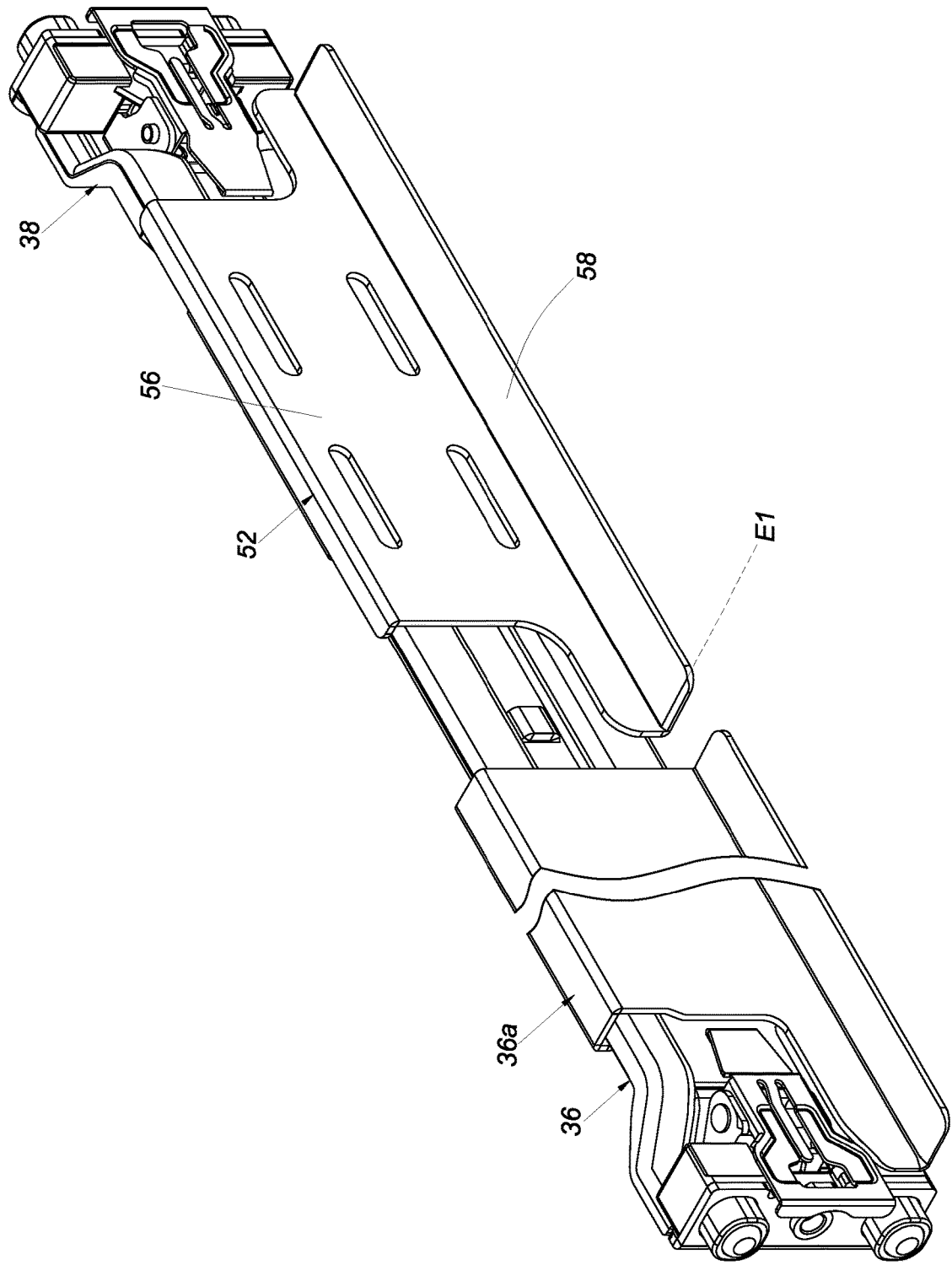
FIG. 17 is a perspective view showing that the auxiliary frame of the supporting assembly in an embodiment of the present invention is at a certain position.
Figure 18:
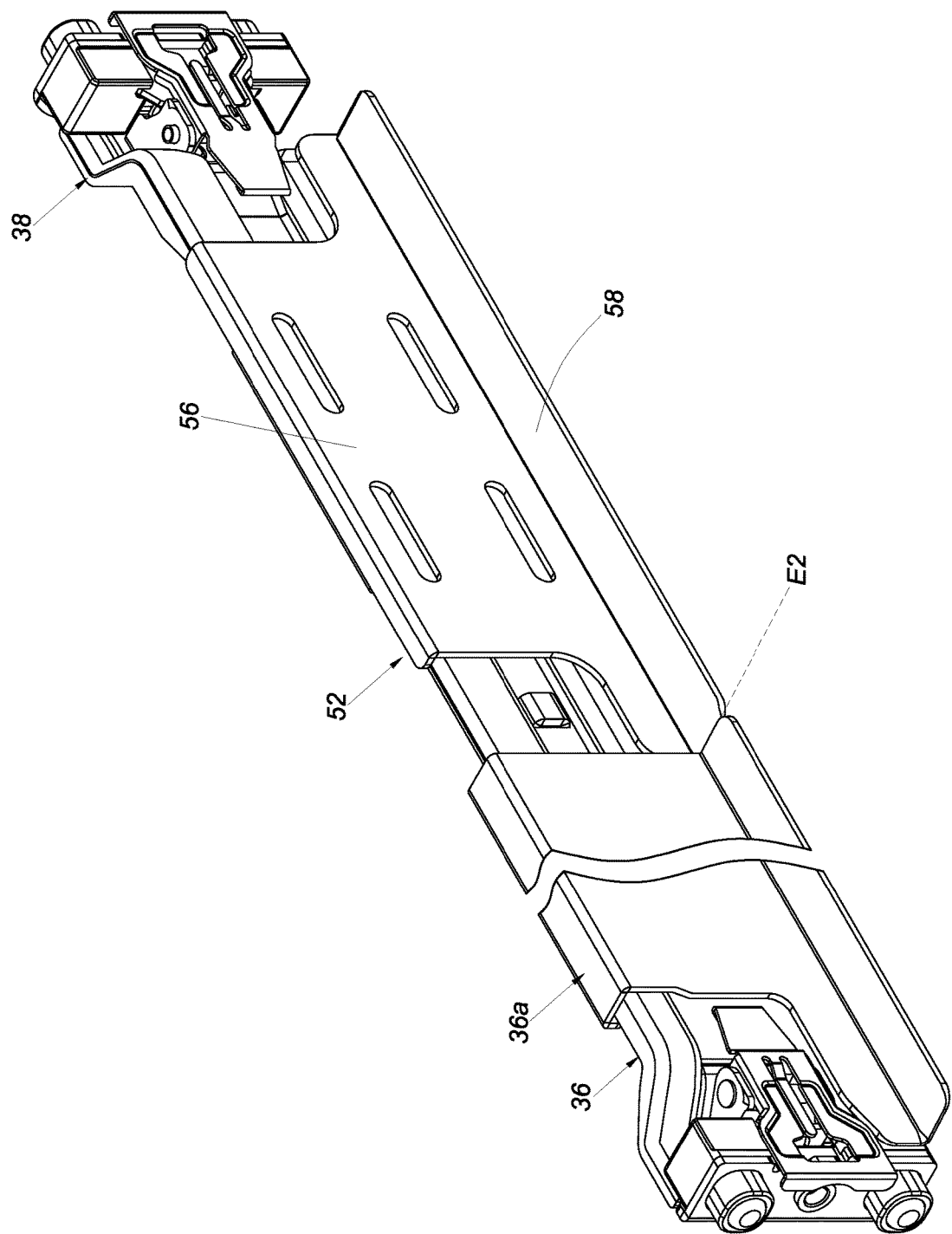
FIG. 18 is a perspective view showing that the auxiliary frame in an embodiment of the present invention is adjusted (i.e., displaced) to another position.

Referring to FIG. 17 and FIG. 18, the auxiliary frame 52 on the second supporting frame 38 can be adjusted, i.e., displaced, in the length direction of the second supporting frame 38 to either one of a first adjusted position E1 (see also FIG. 3) and a second adjusted position E2. The horizontal portion 58 of the auxiliary frame 52, therefore, can be used to support the rear part of the bottom portion 46 of the object 28 at different positions or can adapt to another object whose length is different from that of the object 28 in this embodiment, thereby satisfying different needs.

Figure 19:
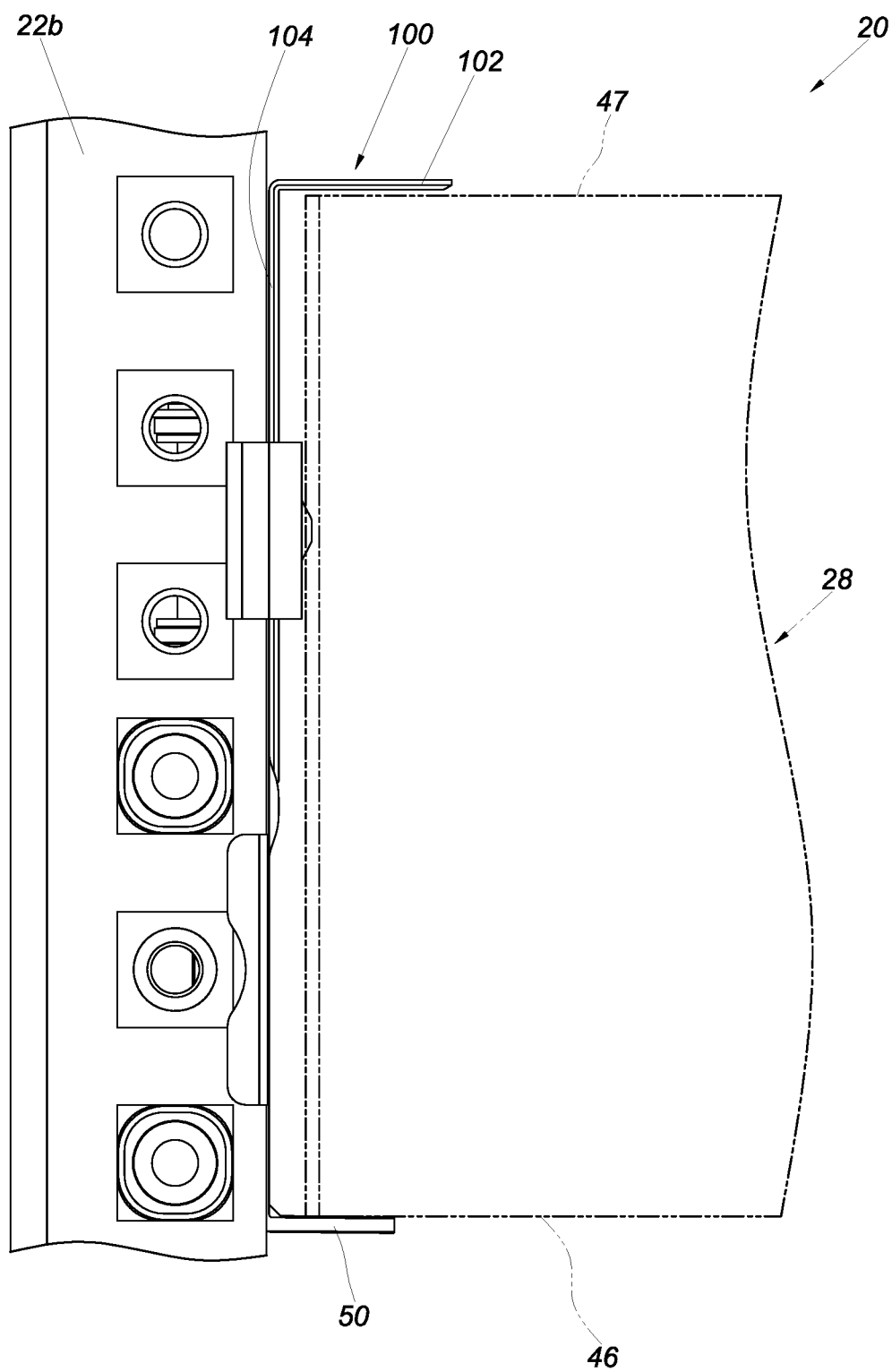
FIG. 19 shows how the retaining member in an embodiment of the present invention prevents the object mounted on the rack from moving in a particular direction.

Referring to FIG. 19, the rack system 20 further includes a retaining member 100 detachably mounted on one of the rear posts 22b, and a retaining portion 102 of the retaining member 100 corresponds in position to a top portion 47 of the object 28 when the object 28 is at the first position P1 (such as but not limited to a retracted position). Preferably, the retaining member 100 includes a connecting portion 104 substantially perpendicularly connected to the retaining portion 102, and the connecting portion 104 is configured to be mounted detachably on the rear post 22b by threaded connection or mechanical engagement. The retaining member 100 can prevent the object 28 from moving upward while the rack system 20 is being transported or handled, thereby enhancing the safety of the transporting or handling process.

Figure 20:
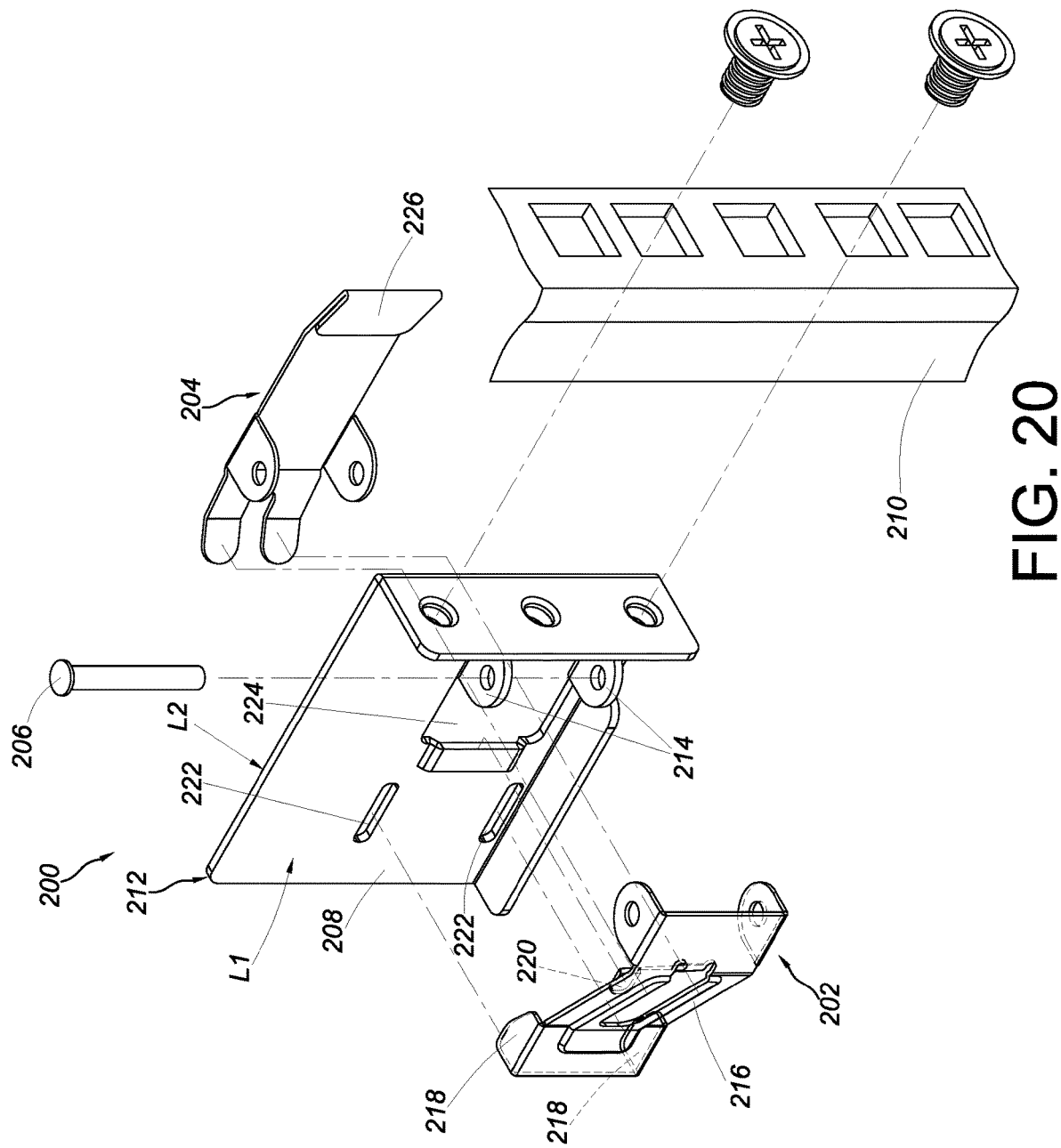
FIG. 20 is an exploded perspective view of the rack and the blocking kit in another embodiment of the present invention.
Figure 21:
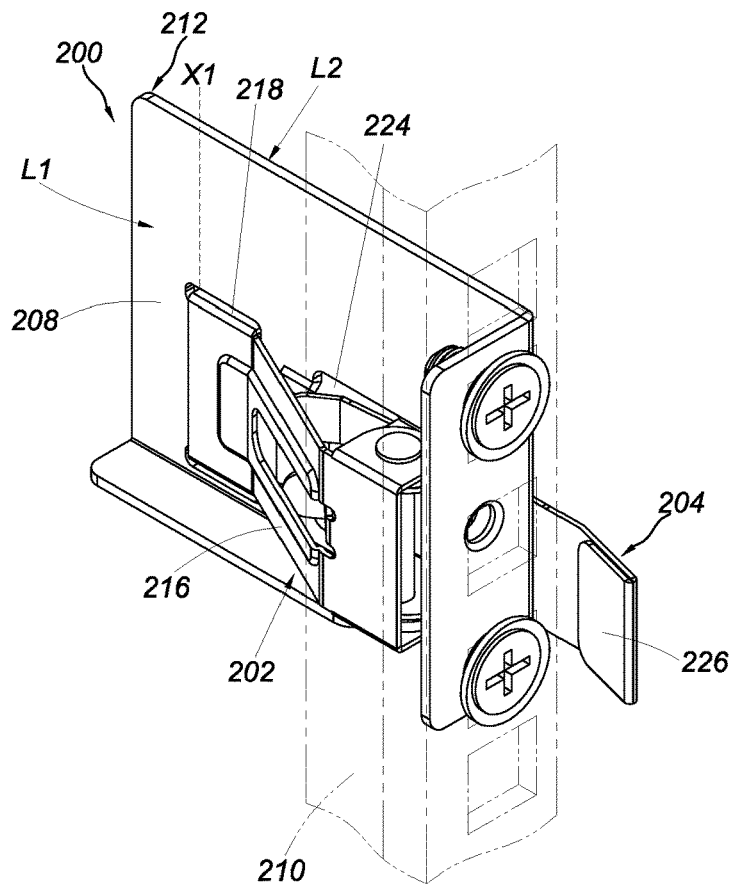
FIG. 21 is an assembled perspective view of the rack and the blocking kit in another embodiment of the present invention.
Figure 22:
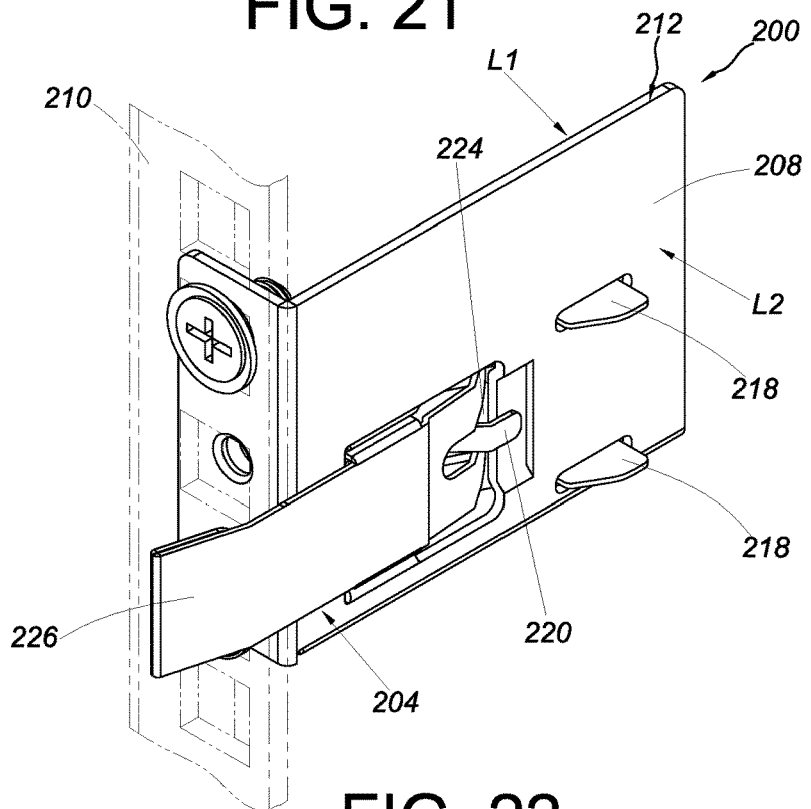
FIG. 22 is an assembled perspective view from another angle showing the rack and the blocking kit in another embodiment of the present invention.

FIG. 20, FIG. 21, and FIG. 22 show the blocking kit 200 in another embodiment of the present invention. The blocking kit 200 is different from its counterpart in the previous embodiment generally in that both the blocking member 202 and the operating member 204 are pivotally connected to the side portion 208 by a shaft member 206, and that the blocking kit 200 does not have the position-limiting portion 77.

More specifically, the blocking kit 200 is coupled to a post 210 (e.g., a front post) of the rack by way of example. The connecting base 212 is detachably mounted on the post 210. The blocking member 202 is arranged at and can be moved with respect to the connecting base 212. The blocking member 202 and the operating member 204 are pivotally connected to the lug 214 of the side portion 208 by the shaft member 206.

Preferably, the blocking member 202 includes an elastic arm 216 and a blocking portion 218 connected to the elastic arm 216. Here, by way of example, the elastic arm 216 is abutted against the side portion 208 via a supporting leg 220, and the blocking portion 218 can pass from the first side L1 to the second side L2 of the side portion 208 of the connecting base 212 through a through hole 222 in the side portion 208. Preferably, the side portion 208 includes an opening 224 in communication with the first side L1 and the second side L2, and the operating member 204 passes through the opening 224 in order to be connected to or abutted against the blocking member 202.

Figure 23:
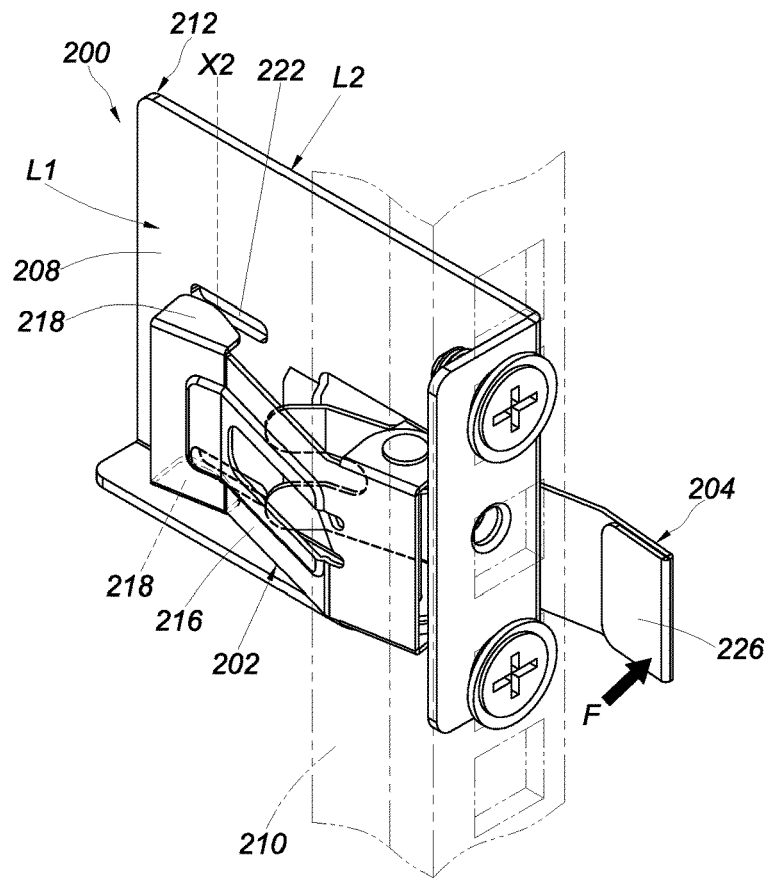
FIG. 23 is a perspective view showing the blocking member of the blocking kit being operated in accordance with another embodiment of the present invention.
Figure 24:
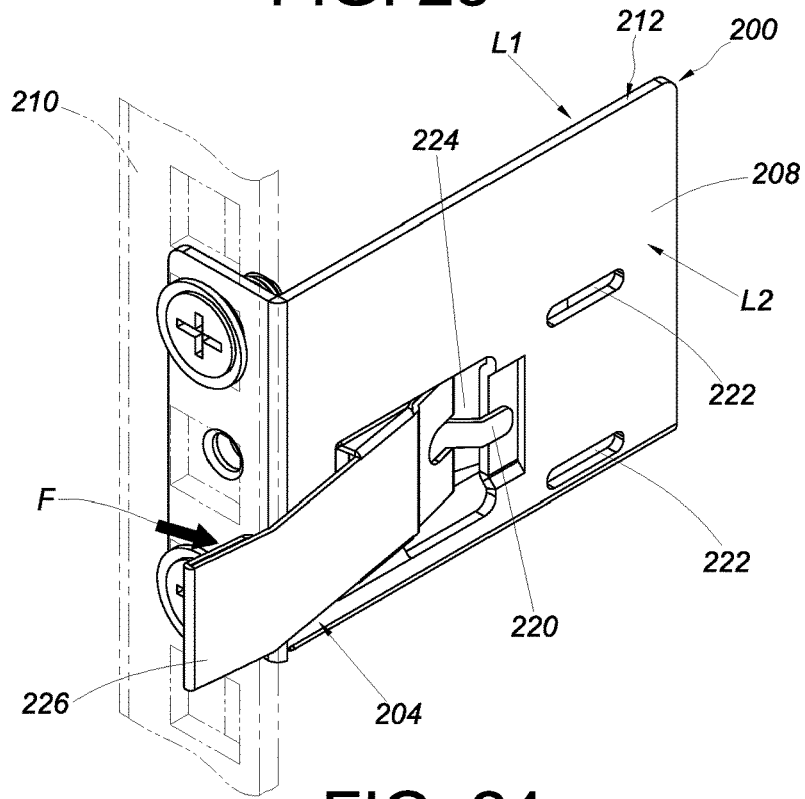
FIG. 24 is a perspective view from another angle showing the blocking member of the blocking kit being operated in accordance with another embodiment of the present invention.

Referring to FIG. 21 to FIG. 24, the blocking member 202 can be operated and thus moved with respect to the connecting base 212 to either one of the locked position X1 (see FIG. 21 and FIG. 22) and the unlocked position X2 (see FIG. 23 and FIG. 24). More specifically, a user may operate the blocking member 202 either directly or by applying a force F to the blocking member 202 through the operating member 204 (or more particularly the operating portion 226) (see FIG. 23 and FIG. 24) in order to move the blocking member 202 from the locked position X1 to the unlocked position X2.

It can be known from the above that the rack system disclosed herein preferably has the following features:

1. The blocking kit 30 is detachably mounted on a post (e.g., a front post 22a) of the rack 22 and can prevent the object 28 from being displaced from the second position P2 in a certain direction.

2. The supporting assembly 24 and the object 28 include the first feature 68 and the second feature 70 respectively. The first feature 68 and the second feature 70 can work with each other to prevent a portion of the object 28 from tilting up with respect to another portion of the object 28 while the object 28 is being displaced from the first position P1 toward the second position P2 in the first direction D1.

3. The auxiliary frame 52 can be adjusted in position, allowing the horizontal portion 58 of the auxiliary frame 52 to meet different needs by supporting the rear part of the bottom portion 46 of the object 28 at different positions or by adapting to objects whose lengths are different from that of the object 28.

4. The retaining member 100 is detachably mounted on a post (e.g., a rear post 22b) of the rack 22 to keep the object 28 from moving upward while the rack system 20 is being transported or handled; thus, the safety with which to transport or handle the rack system 20 is increased.

While the present invention has been disclosed through the foregoing embodiments, it should be understood that the embodiments are not intended to be restrictive of the scope of the invention. The scope of patent protection sought by the applicant is defined by the appended claims.

What is claimed is:

1. A rack system, comprising:
a rack including a plurality of posts;
a first supporting assembly mounted on a first side of the rack;
a second supporting assembly mounted on a second side of the rack;
an object supported between the first supporting assembly and the second supporting assembly; and
a blocking kit coupled to the rack and including:
a connecting base detachably mounted on one of the posts;
a blocking member movable to either one of a locked position and an unlocked position with respect to the connecting base; and
a first feature and a second feature, the first feature provided at one of the first supporting assembly and the object and at least being an elastic member, and the second feature provided at the other of the first supporting assembly and the object and being a longitudinal space with a border;
wherein when the object reaches a second position from a first position after displacement in a first direction, the blocking member is at the locked position to block the object and thereby prevent the object from displacement from the second position in the first direction;
wherein when the blocking member is at the unlocked position, the object is no longer blocked by the blocking member and is therefore allowed to leave the second position; and
wherein the first feature and the second feature are configured to work with each other to prevent a rear portion of the object from tilting up with respect to a front portion of the object while the object is being displaced from the first position toward the second position.

2. The rack system of claim 1, wherein the blocking member is arranged at the connecting base and is movable by being operated.

3. The rack system of claim 2, wherein the connecting base includes a mounting portion and a side portion substantially perpendicularly connected to the mounting portion, the mounting portion is detachably connected to the one of the posts, and the blocking member is located at the side portion.

4. The rack system of claim 1, wherein the object includes a first sidewall and a second sidewall, the first sidewall and the second sidewall correspond in position to the first supporting assembly and the second supporting assembly respectively, at least one of the first sidewall and the second sidewall has a front end portion and a rear end portion, and there is a structural feature between the front end portion and the rear end portion of the at least one of the first sidewall and the second sidewall so that, when the object is at the second position and the blocking member is at the locked position, the blocking member blocks the object through the structural feature.

5. The rack system of claim 1, wherein the first feature is provided at the first supporting assembly, and the second feature is provided at the first sidewall of the object as the longitudinal space with the border.

6. The rack system of claim 5, wherein the longitudinal space with the border has a first end and a second end opposite the first end.

7. The rack system of claim 1, A rack system, comprising:
a rack including a plurality of posts;
a first supporting assembly mounted on a first side of the rack;
a second supporting assembly mounted on a second side of the rack;
an object supported between the first supporting assembly and the second supporting assembly; and
a blocking kit coupled to the rack and including:
a connecting base detachably mounted on one of the posts; and
a blocking member movable to either one of a locked position and an unlocked position with respect to the connecting base;
wherein when the object reaches a second position from a first position after displacement in a first direction, the blocking member is at the locked position to block the object and thereby prevent the object from displacement from the second position in the first direction;
wherein when the blocking member is at the unlocked position, the object is no longer blocked by the blocking member and is therefore allowed to leave the second position; and
wherein one of the first supporting assembly and the second supporting assembly includes a first supporting frame and a second supporting frame, the first supporting frame and the second supporting frame are connected and are extensible and retractable with respect to each other, there are a front mounting member arranged at the first supporting frame and a rear mounting member arranged at the second supporting frame, the front mounting member and the rear mounting member are mounted on a front post and a rear post of the rack respectively, and the connecting base of the blocking kit is detachably mounted on the front post.

8. The rack system of claim 7, wherein the first supporting frame includes a vertical portion and a horizontal portion substantially perpendicularly connected to the vertical portion, and the horizontal portion is configured for supporting a bottom portion of the object.

9. The rack system of claim 8, further comprising an auxiliary frame arranged at the second supporting frame, wherein the auxiliary frame is displaceable, and thus adjustable, along a length direction of the second supporting frame, the auxiliary frame includes a vertical portion and a horizontal portion substantially perpendicularly connected to the vertical portion of the auxiliary frame, and the horizontal portion of the auxiliary frame is configured for supporting the bottom portion of the object.

10. The rack system of claim 7, further comprising a retaining member detachably mounted on the rear post so that, when the object is at the first position, a retaining portion of the retaining member corresponds in position to a top portion of the object.

11. A rack system, comprising:
a rack including a front post and a rear post;
a supporting assembly mounted on the front post and the rear post via a front mounting member and a rear mounting member respectively;
an object carried by the supporting assembly; and
a blocking kit coupled to the rack and including:
a connecting base mounted on the front post; and
a blocking member arranged at the connecting base;
wherein when the object reaches a second position from a first position after displacement in a first direction, the blocking member is at a locked position to block the object and thereby prevent the object from displacement from the second position in the first direction;
wherein when the blocking member is at an unlocked position, the object is allowed to leave the second position; and
wherein the supporting assembly further includes a first feature, the object includes a second feature, and the first feature and the second feature are configured to work with each other to prevent a rear portion of the object from tilting up with respect to a front portion of the object while the object is being displaced from the first position and displaced in the first direction.

12. The rack system of claim 11, wherein the blocking kit further includes an operating member for operating the blocking member and thereby moving the blocking member from the locked position to the unlocked position.

13. The rack system of claim 12, wherein the connecting base includes a mounting portion and a side portion bent with respect to the mounting portion, the mounting portion is connected to the front post, and the blocking member is pivotally connected to the side portion.

14. The rack system of claim 11, wherein one of the first feature and the second feature is an elastic member, and the other of the first feature and the second feature is a longitudinal space with a border.

* * * * *